United States Patent [19]

Sakamoto et al.

[11] Patent Number: 5,412,342

[45] Date of Patent: May 2, 1995

[54] POWER AMPLIFIER DEVICE COMPRISING A PLURALITY OF FEEDFORWARD DISTORTION COMPENSATING CIRCUITS IN PARALLEL

[75] Inventors: Hironori Sakamoto; Akira Ito, both of Mitaka; Toshio Nojima, Yokosuka, all of Japan

[73] Assignees: Japan Radio Co., Ltd.; Nippon Telephone & Telephone Corporation; NTT Mobile Communication Network Inc., all of Tokyo, Japan

[21] Appl. No.: 4,466

[22] Filed: Jan. 14, 1993

[30] Foreign Application Priority Data

Jan. 16, 1992 [JP] Japan ............... 3-005416

[51] Int. Cl.⁶ ............................................. H03F 1/32
[52] U.S. Cl. .................................. 330/149; 330/151; 455/50.1
[58] Field of Search ............... 330/149, 151; 328/163; 375/60; 455/50.1, 63

[56] References Cited

U.S. PATENT DOCUMENTS

| | | | |
|---|---|---|---|
| 4,598,254 | 7/1986 | Saito et al. | 330/286 |
| 4,926,136 | 5/1990 | Olver | 330/149 |
| 5,166,634 | 11/1992 | Narahashi | 330/151 |

FOREIGN PATENT DOCUMENTS

0135407A1 3/1985 European Pat. Off. .

*Primary Examiner*—James B. Mullins
*Attorney, Agent, or Firm*—Frishauf, Holtz, Goodman & Woodward

[57] ABSTRACT

For supply to first and second feedforward distortion compensating circuits 33(1), 33(2) connected in parallel, a two-divider 31 divides into signals of a common phase and a common amplitude an input or composite radio frequency signal supplied to an input terminal 11. The composite radio frequency signal collectively has a plurality of radio frequency signals of different frequencies. A two-combiner 35 combines component outputs of the feedforward circuits in inphase as an amplified output signal which is supplied to an output terminal 13. In general, N feedforward circuits (N being an integer not less than two) are connected in parallel and are supplied with the input radio frequency signal through an N-divider. Component outputs of the feedforward circuits are combined in inphase as the output signal by an N-combiner. Alternatively, the input radio frequency signal is divided into signals of a predetermined phase difference and of a common amplitude by the N-divider. In this case, the component outputs of the feedforward circuits are combined in a phase of cancelling the predetermined phase difference by the N-combiner.

4 Claims, 7 Drawing Sheets

INPUT SIGNALS (POINT a OF FIG.1)

OUTPUT SIGNALS OF MAIN AMP 15 (POINT d OF FIG.1)

OUTPUT SIGNALS OF 1ST LOOP 16 (POINT g OF FIG.1)

OUTPUT SIGNALS (POINT j OF FIG.1)

θ: NEGATIVE ERROR
a: NEGATIVE ERROR

θ: POSITIVE ERROR
a: POSITIVE ERROR

θ: NEGATIVE ERROR
a: POSITIVE ERROR

θ: POSITIVE ERROR
a: NEGATIVE ERROR

POWER AMPLIFIER DEVICE COMPRISING A PLURALITY OF FEEDFORWARD DISTORTION COMPENSATING CIRCUITS IN PARALLEL

BACKGROUND OF THE INVENTION

This invention relates to a power amplifier device for radio frequency signals and, more particularly, to a power amplifier device comprising a feedforward distortion compensating circuit (abbreviated to FF circuit in the following).

For simultaneous transmission of a plurality of carriers, a radio communication apparatus, typically in a base station of mobile communication, usually comprises amplifier circuits, equal in number to the carriers. Outputs of the amplifier circuits are combined by an antenna duplexer. This system has problems in that the apparatus becomes bulky with an increase in the number of carriers and in that a transmission frequency depends on the duplexer and can not be readily changed.

These problems would at once be solved if a power amplifier device were available for simultaneous amplification (common amplification) of a multiplicity of carriers. The carriers will be referred to as a plurality of radio frequency signals of different frequencies signal for convenience of description. In the mobile communication in particular, it would be possible at the same time to get rid of frequency restriction by the duplexer and to efficiently use frequencies. A conventional power amplifier device, however, has a nonlinearity which inevitably results in inter-modulation distortions on carrying out simultaneous amplification and gives rise to a deterioration of other communications of the mobile communication.

In order to prevent this, a power amplifier device must have a very high saturation output level. For example, let it be assumed that an output level per one carrier be 1 W, the carriers be ten in number, and the inter-modulation distortion should result in a spurious intensity of minus 60 dB. In order to subject the carriers to simultaneous amplification, the power amplifier device must have a saturation output of at least 1 kW and would be bulky. Practical implementation is consequently impossible with no improvement because both circuitry and power consumption are very uneconomical A distortion compensating circuit has therefore been used in the power amplifier device. This is in order to reduce the saturation output level and to solve the problem of uneconomicalness.

Various power amplifier devices with distortion compensating circuits are already known. Among them, most excellent in view of a wide distortion compensating band, stability, and an amount of improvement in a distortion compensating effect is one that comprises an FF circuit.

Briefly speaking, a conventional power amplifier device comprises either a single FF circuit or a plurality of FF circuits in multiplicate. When the power amplifier device comprises the single FF circuit, the power amplifier device comprises a plurality of main amplifier circuits in parallel.

The conventional power amplifier devices and problems thereof will later be described in detail.

SUMMARY OF THE INVENTION

An object of the present invention is to provide a power amplifier device capable of solving the problems.

In order to achieve the above-described object, this invention provided an amplifier device which is for amplifying a plurality of radio frequency signals supplied to an input terminal with different frequencies for supply to an output terminal and which comprises an N-divider (N being an integer not less than two) for dividing the radio frequency signals into N radio frequency signals of a common phase and of a common amplitude, N FF circuits having a common gain and a common phase characteristic for amplifying the N radio frequency signals to produce N signal components, respectively, and an N-combiner for combining, for supply to the output terminal in inphase, the N signal components.

In accordance with a modification, the above-described object is achieved by dividing using the N-divider in dividing into the radio frequency signals with a common amplitude and with a predetermined phase difference and by using the N-combiner in combining the N signal components in a phase of cancelling the predetermined phase difference.

Attention is directed according to this invention to the fact that an inphase combination of the signal components of the N FF circuits results in an N times increase in levels of the signals components at the output terminal and that an increase does not occur in a level of distortion components which incessantly irregularly vary to compensate for amplitudes and phases of thereof. As a consequence, an increase is attained in a rate of signal components versus distortion components, namely, in an attenuation of intermodulation distortion, to an amount of about $(10 \times \log N)$ dB as compared with use of a single FF circuit.

DESCRIPTION OF THE PREFERRED EMBODIMENTS

Figure 1:
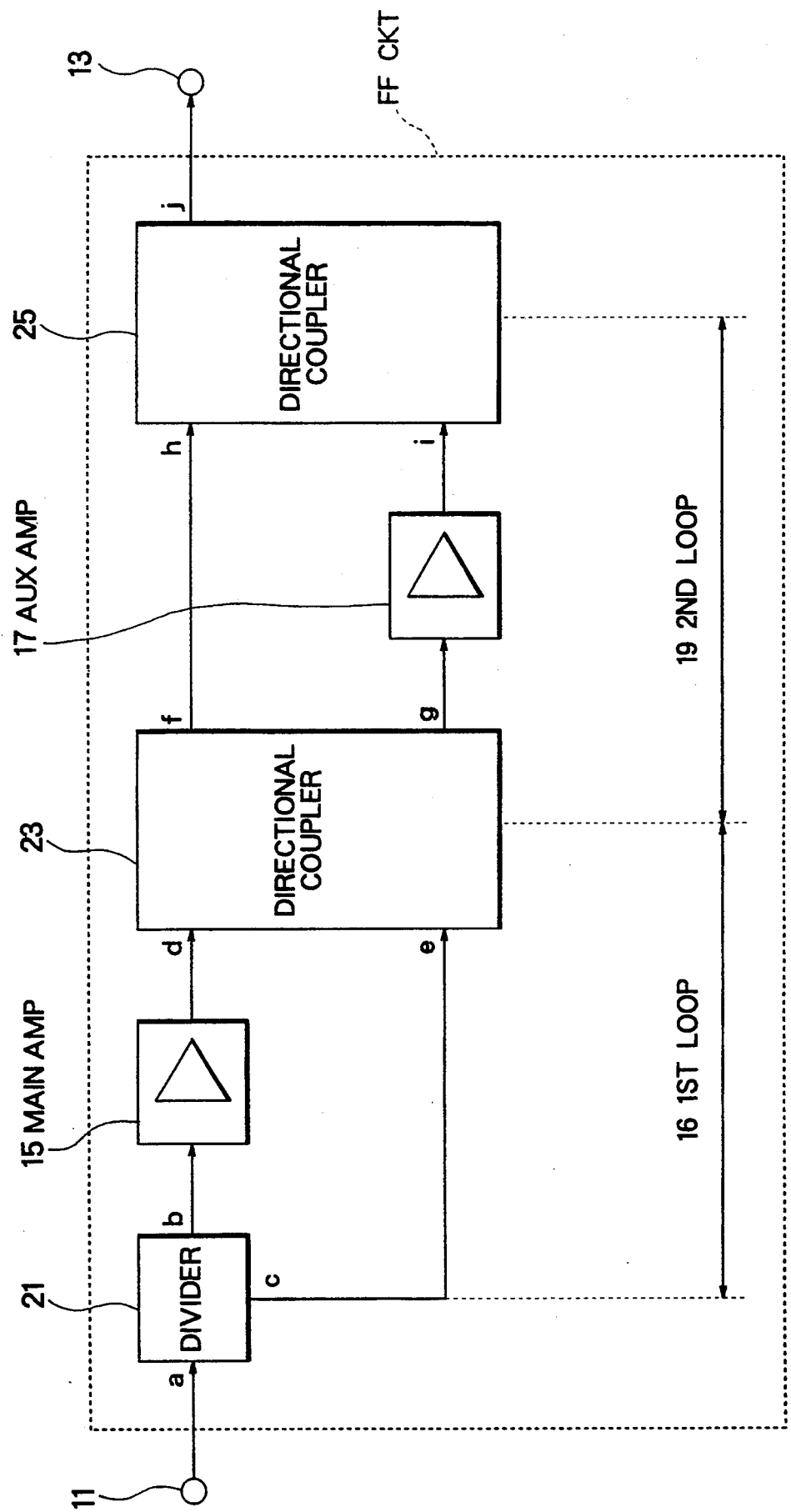
FIG. 1 is a block diagram of a conventional power amplifier device.
Figure 2A:
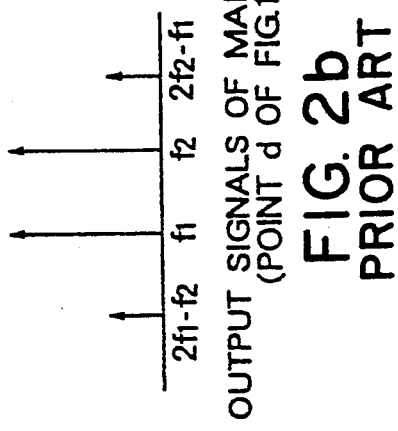
FIG. 2(a) to FIG. (d) are diagrams for use in describing distortion compensation in the power amplifier device depicted in FIG. 1.
Figure 2B:
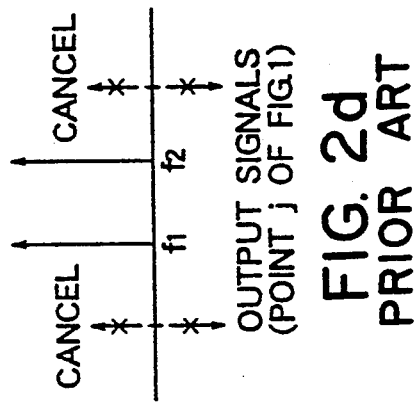
Figure 2C:
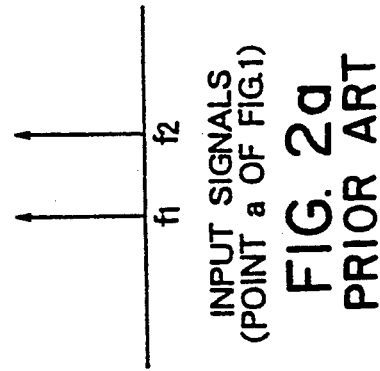
Figure 2D:
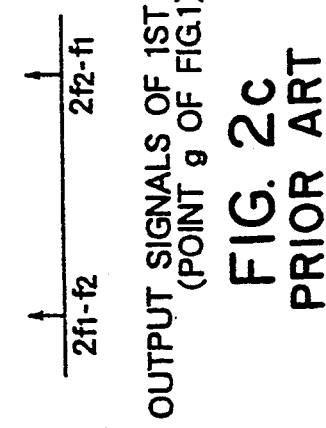

Referring to FIG. 1, a conventional power amplifier device comprising a single FF circuit will first be described for a better understanding of this invention. The conventional power amplifier device has device input and device output terminals 11 and 13 and comprises a main amplifier circuit. (MAIN AMP) 15. A first loop 16 extracts only nonlinear distortion components produced by power amplifying elements used in the main amplifier circuit 15. An auxiliary amplifier circuit (AUX AMP) 17 amplifies the extracted distortion components. A second loop 19 cancels the distortion by supply in antiphase to an output portion of the main amplifier circuit. 15. These loops 16 and 19 are collectively called an FF loop in abbreviation.

FIG. 2 (a) to FIG. (d) are for use in describing distortion compensation carried out by the FF loop and show processes of amplifying two signals having frequencies f1 and f2. Operation of the conventional power amplifier device will now be described in detail with reference to FIGS. 1 and 2(a) to (d).

Having a spectrum depicted in FIG. 2 (a), the two signals are supplied from an input terminal 11 to a point a of FIG. 1, namely, to a divider 21. These signals are amplified by the main amplifier circuit 15 to have, as shown in FIG. 2 (b), third order inter-modulation distortions (2f1–f2) and (2f2–f1) besides the two signals. In practice, fifth and higher order distortions are additionally produced. Only the third order distortion components are herein depicted merely for convenience of description.

The first loop 16 compares input signals of the main amplifier circuit 15, shown in FIG. 2 (a), with output signals shown in FIG. 2 (b) and extracts only the distortion components depicted in FIG. 2 (c).

The second loop 19 adds in antiphase the output signals of the main amplifier circuit 15, shown in FIG. 2 (b), to the distortion components extracted by the first loop 16 as depicted in FIG. 2 (c) and cancels the distortion in the manner illustrated in FIG. 2 (d). The fifth and higher order distortion components are additionally cancelled like the third order distortion components.

Optimum operation conditions of operation of the power amplifier device are as follows. In the first loop 16, a path a-b-d-g and another path a-c-e-g should have a common electric length so that signals are transmitted through these two paths in antiphase and with a common amplitude to a terminal g of an input side directional coupler 23. In the second loop 19, a path d-f-h-j and another path d-g-i-j should have a common electric length so that signals are transmitted through these two paths in antiphase and with a common amplitude to a terminal j of an output side directional coupler 25.

In practice, the power amplifier device comprises a gain and phase adjusting circuit (not shown) in either one of the paths f-h and g-i in order to satisfy the optimum conditions. The adjusting circuit is often automatically adjusted as an automatic adjusting type.

It should be noted in connection with the above that the FF circuit has a distortion compensating capability which is restricted because of the following.

(1) Restriction by unbalance in the second loop 19:

Theoretically, it is possible to completely cancel the distortion components if addition were carried out of signals having a correctly common amplitude and correctly reversed phases. Practically, the distortion components of the main amplifier circuit 15 can not completely be cancelled because the loops can not be completely balanced. This gives rise to irregular fluctuations, although small, in gain and phase no matter how the gain and the phase are optionally adjusted.

(2) Restriction by a control error in automatic control:

It is possible by automatic adjust by a device of the above-described automatic adjusting type to automatically adjust the gain and the phase of the FF loop to satisfaction of the optimum conditions. A control error is, however, inevitable in practice. This gives rise to a remain of the distortion components.

(3) Restriction by nonlinearity of the auxiliary amplifier circuit 17:

Theoretically, the auxiliary amplifier circuit 17 gives rise to no nonlinear distortions. Practically, nonlinear distortions are unavoidable. This results in introduction of distortion components in output.

Figure 3:
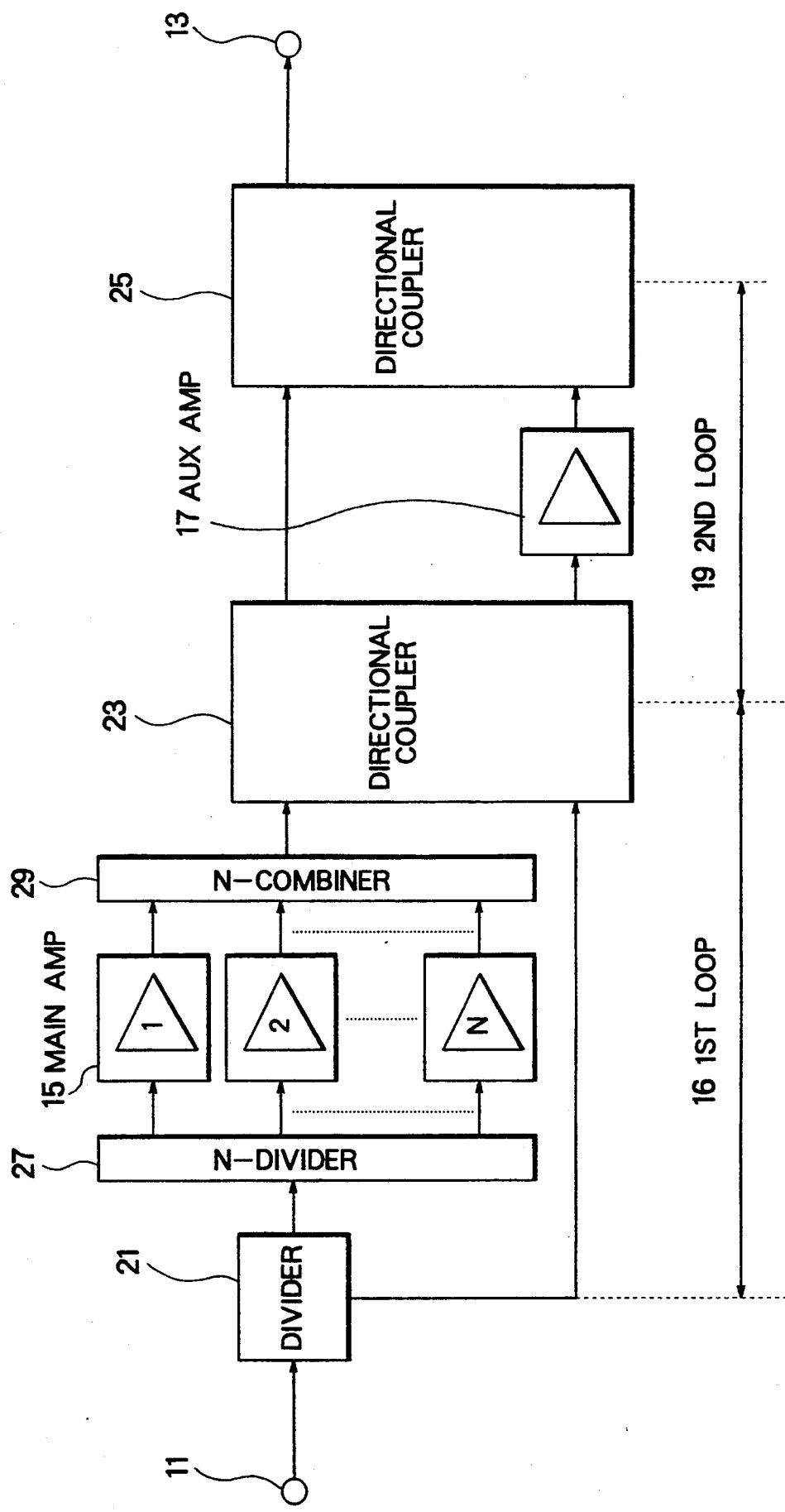
FIG. 3 is a block diagram of another conventional power amplifier device.

Turning to FIG. 3, description will proceed to another conventional power amplifier device. Power amplifying elements, such as transistors, can deal with restricted power per one element. The power amplifier device for large power therefore comprises an N-divider 27 (which produces N output signals) and an N-combiner 29 (which combines N input signals) for parallel operation of N main amplifier circuits 15, where N is an integer not less than two.

Figure 4:
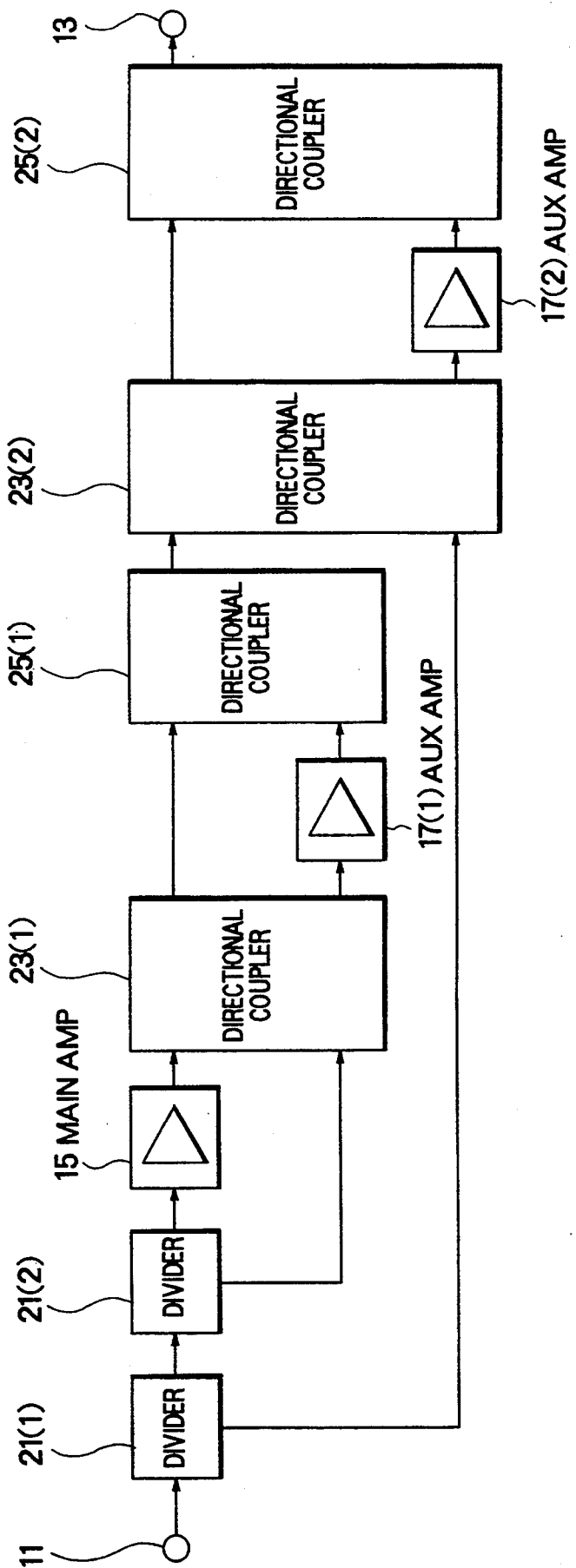
FIG. 4 is a block diagram of still another conventional power amplifier device.

Turning to FIG. 4, still another conventional power amplifier device comprises first and second auxiliary amplifier circuits 17(1) and 17(2), first and second dividers 21(1) and 21(2), first and second input side directional couplers 23(1) and 23(2), and first and second output side directional couplers 25(1) and 25(2) as the auxiliary amplifier circuit 17, the dividers 21, the input side directional coupler 23, and the output side directional coupler 25 of FIG. 1 in order to multiplex the FF loops.

It may be pointed out here that the conventional power amplifier device with the FF circuit has in the manner described above a problem such that distortion components remain in output signals due to restriction imposed on distortion compensation by the FF circuit. In the conventional amplifier circuit, remains of the distortion components have been kept within a predetermined value by increasing parallel main amplifier circuits 15 in number to remove the remains of the distortion components. This has resulted in problems of an increased cost of the device and an increase in power consumption. Improvements have eagerly desired.

In FIG. 4, FF loops are multiplexed in order to solve the problems of deterioration of distortion compensation capability by nonlinear distortions of the auxiliary amplifier circuit 17. This, however, results in complication of circuitry and an increase in loss introduced by directional couplers 23 (suffixes omitted) and 25 (suffixes omitted) used between the main amplifier circuit 15 and the output terminal 13 and is not practical. In particular, the loss between the main amplifier circuit 15 and the output terminal 13 is very serious in an amplifier device of a high output power.

In the power amplifier device described above with reference to FIG. 3, parallel connection of the main amplifier circuits 15 does not necessarily result in rise of reliability. More particularly, a reduction appears in gain between the N-divider 27 and the N-combiner 29 should one of the main amplifier circuits 15 be involved in suspension of operation. This results in an unbalance in the first loop 16 and failure in due distortion compensation to suddenly increase the distortion components in the output signals.

Figure 5:
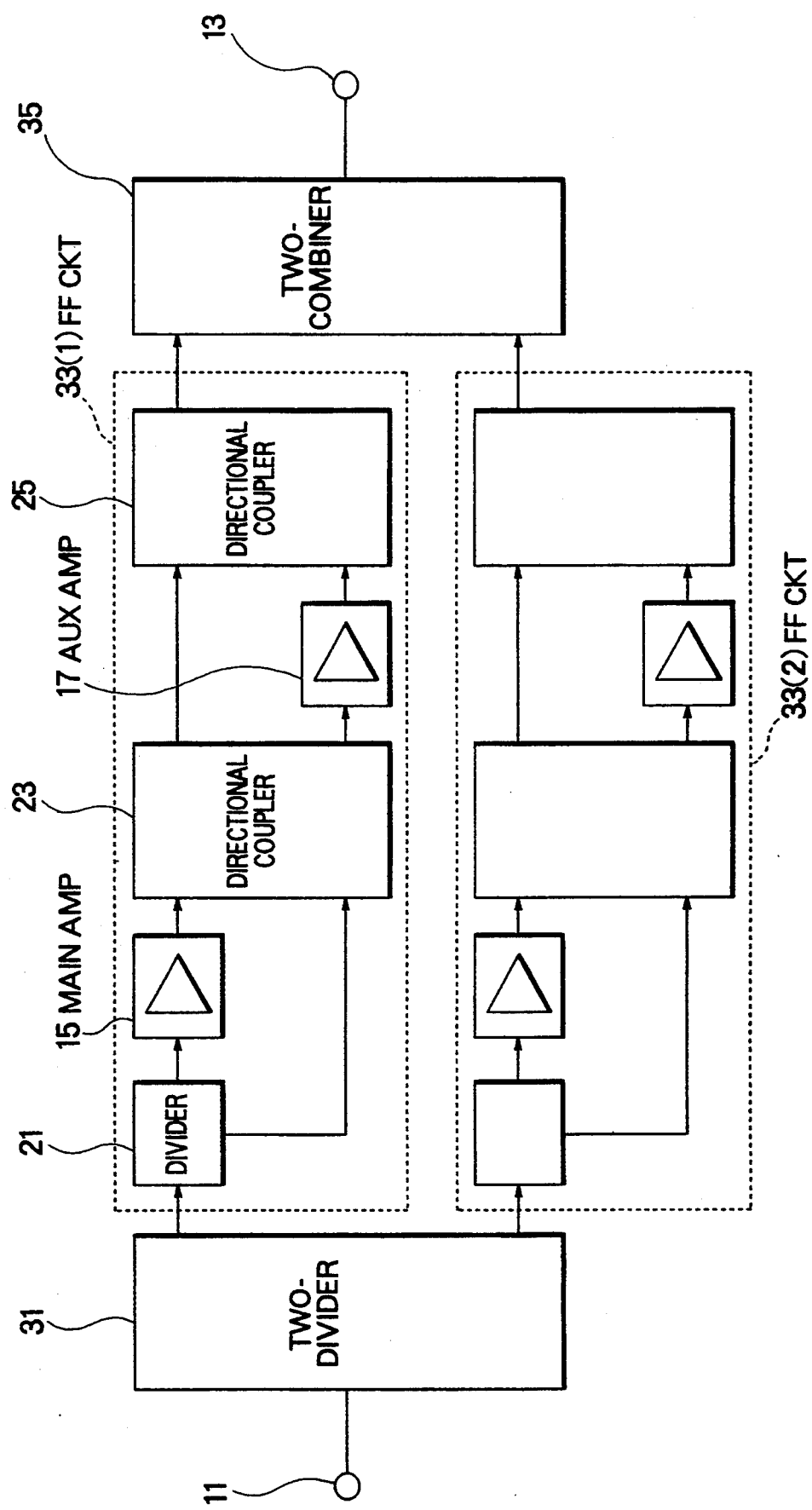
FIG. 5 is a block diagram of a power amplifier device according to a first embodiment of this invention.

Turning to FIG. 5, description will proceed to a power amplifier device according to a first embodiment of this invention. In the power amplifier device, a two-divider (which divides an input signal into two signals) 31 divides into two signals of a common phase and a common amplitude a signal supplied from an input terminal 11. More specifically, the input terminal receives a plurality of radio frequency signals of different frequencies f1 and f2 (FIG. 2) collectively as a composite radio frequency signal. The two-divider 31 divides the composite radio frequency signal into two composite radio frequency signals of a common phase and of a common amplitude. Two FF circuits 33(1) and 33(2) are similar in structure and serve to form FF loops for the signals produced by the two-divider 31. More particularly, the two FF circuits 33(1) and 33(2) have a common gain and a common phase characteristic and amplify the two composite radio frequency signals to produce two signal components, respectively. For supply to an output terminal 13, a two-combiner (which combines two input signals) 35 combines outputs 33 (suffixes omitted) in inphase. That is, the two combiner 35 combines, for supply to the output terminal 13 in phase, the two signal components supplied thereto. A combination of the two-divider 31, the two FF circuits 33(1) and 33(2), and the two combiner 35 serves as an amplifying section which amplifies, for supply to the output terminal 13, the composite radio frequency signal.

The FF circuits 33 have a common gain and a common phase characteristic between their inputs and outputs. As a consequence, the two-combiner 35 combines components of a main signal component with their amplitudes in common and their phases in inphase. This results at the output terminal 13 in a raise of twice, namely, 3 dB, in an amplitude of the main signal component when compared with a case where only one of the FF circuits 33 is used.

In the manner described hereinabove, the FF circuits 33 produce, as a result of restriction in their distortion compensation capabilities, distortion components which have incessantly irregularly varying amplitudes and phases, although small. Use of the FF circuits 33 in duplicate therefore does not result in complete cancellation although capable of suppressing a sudden increase which has been conventionally inevitable.

Figure 6A:
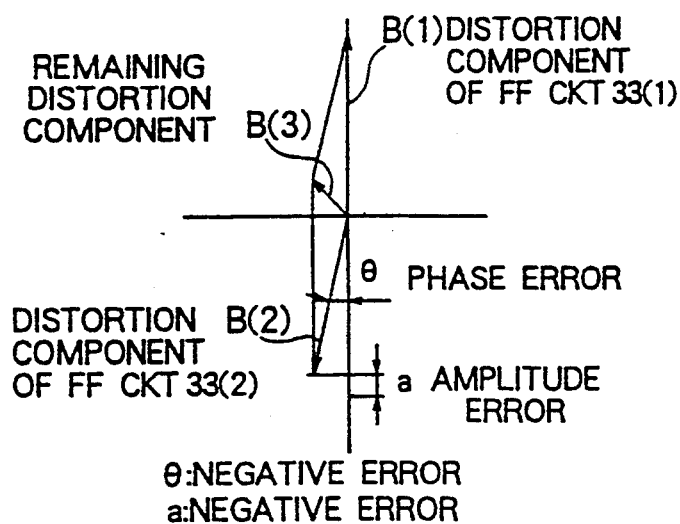
FIG. 6(a) to FIG. (d) are diagrams for use in describing a remaining distortion in the power amplifier device illustrated in FIG. 5.
Figure 6B:
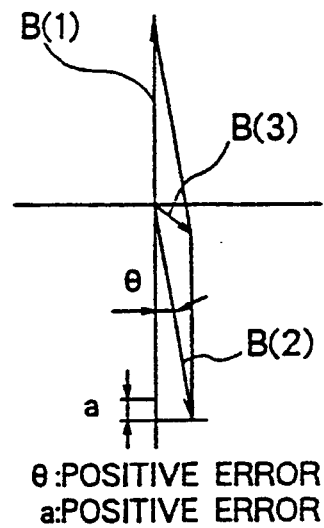
Figure 6C:
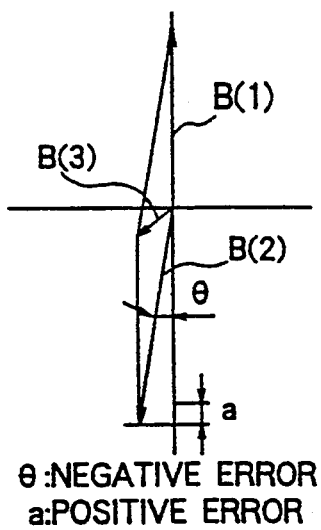
Figure 6D:
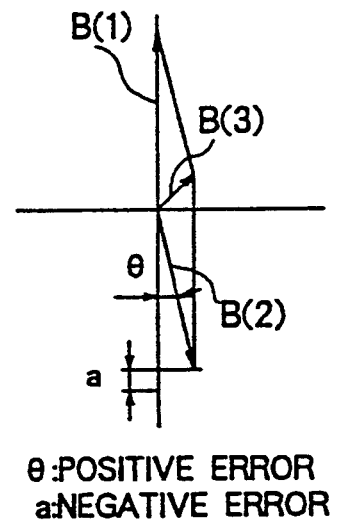

Turning to FIG. 6(a) to FIG. (d) with reference to FIG. 5 continued, in vector states of distortion components B(1) and B(2) of the two FF circuits 33 and a remaining distortion component B(3), the distortion components B (suffixes omitted) have errors "θ" and "a" when compared with an ideal phase and amplitude state (antiphase and equal amplitude). In FIG. 6(a), the errors "θ" and "a" are both negative errors. In FIG. 6(b), these are both positive errors. In FIG. 6(c), the error "θ" is a negative error and the error "a" is a positive error. In FIG. 6(d), the error "θ" is a positive error and the error "a" is a negative error.

In FIG. 6(a) to FIG. (d), it is understood that the remaining distortion component B(3) has an amplitude and a phase dependent on the amplitude error "a" and the phase error "θ". The amplitude and the phase of the remaining distortion components B(3) irregularly vary dependent on incessant and irregular variations in the errors "a" and "θ".

As a consequence, amplitudes and phases of the distortion components of the FF circuits 33 may momentarily happen to be equal (the remaining distortion component B(3) being rendered twice) or to cancel each other (the remaining distortion component B(3) becoming zero). Such cases, however, seldom appear. It is confirmed that the distortion components of the signal of the output terminal 13 have levels which are substantially equal to those of the distortion component (B(1) or B(2)) of each FF circuit 33.

This shows that the rate of the main signal components versus the distortion components in the output terminal 13, namely, the attenuation of intermodulation distortion, is improved by 3 dB as compared with use of a single FF circuit. The attenuation of intermodulation distortion is improved also by 3 dB as compared with the conventional distortion compensating circuit which is described with reference to FIG. 3 and in which the number two is used as the number N of the main amplifier circuits 15 connected in parallel.

Figure 7:
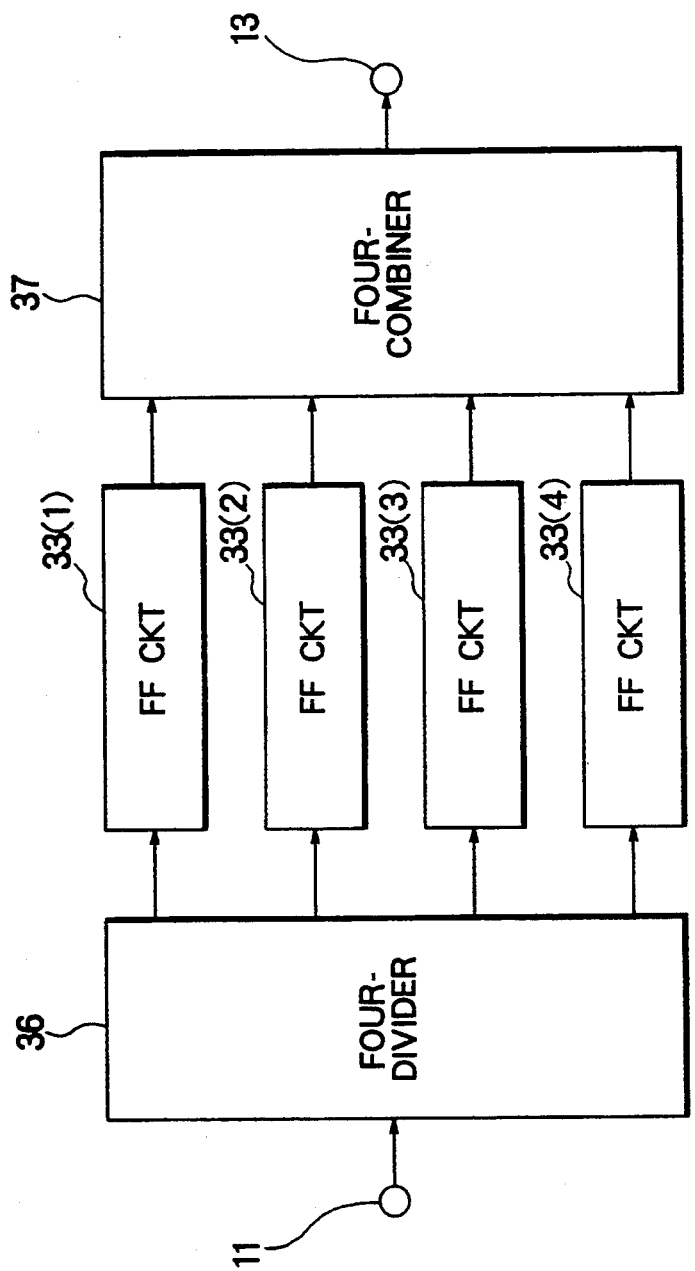
FIG. 7 is a block diagram of a power amplifier device according to a second embodiment of this invention.

Turning to FIG. 7, a power amplifier device according to a second embodiment of this invention comprises a four-divider 36 divides into four signals of a common phase and a common amplitude a signal supplied from the input terminal 11. First through fourth FF circuits 33(1) to 33(4) are similar in structure and serve to form FF loops for the signals produced by the four-divider 36. For supply to the output terminal 13, a four-combiner 37 combines outputs of the FF circuits 33 (suffixes omitted) in inphase.

In the manner described before, the power amplifier device of such a structure improves the attenuation of intermodulation distortion by 6 dB as compared with a conventional one in which use is made of either a single FF circuit or four main amplifier circuits 15 connected in parallel.

As is apparent from FIGS. 5 and 7, similar is a case in which either three or at least five FF circuits are put into parallel operation. When N (an optional integer which is not less than two) FF circuits are put into parallel operation, the attenuation of intermodulation distortion is improved by $(10 \times \log N)$ dB.

The description will now proceed to technical merits achieved, in comparison with a conventional power amplifier device comprising a single FF circuit, by an amplifier device according to the case being described.

As described, parallel operation of n FF circuits in this case results in an improvement of $(10 \times \log N)$ dB in the attenuation of intermodulation distortion as compared with use of a single FF circuit. It therefore results that the power amplifier device of the case provides greater output power as compared with a conventional one in which the power amplifying elements are equal in number and by which the remaining distortion component is produced with an identical level.

In other words, a predetermined output power is obtained by the power amplifier device of the case with a reduced number of power amplifying elements and with less power consumption in comparison with a conventional one. That is, it is possible to attain compactness and a decrease in the power consumption.

By way of example, the description will be made in connection with the power amplifier device illustrated with reference to FIG. 7. In this example, the attenuation of intermodulation distortion is improved by 6 dB as above. It is confirmed on the other hand that an increase of 1 dB in the level of the output signal results in a deterioration by 2 dB in the attenuation of intermodulation distortion. As a result, the power amplifier device of the structive of FIG. 7 can raise the output power twice, namely, by 3 dB, when compared in its output power with a conventional power amplifier device which provides an identical attenuation of intermodulation distortion of the output signal. In other words, the power amplifier device has a half bulkiness and half power consumption as compared with a conventional one that provides an equal output power and an equal attenuation of intermodulation distortion.

When such a power amplifier device is used as a simultaneous or common amplifier device in mobile communication in producing an equal output power per carrier as before, twice as many carriers can be simultaneously amplified with an equal scale and equal power consumption. Twice as much output power can be obtained per carrier if a predetermined number of carriers are dealt with. Scale of the device and its power consumption can be reduced to a half if an equal number of carriers are processed with an equal output power per carrier.

The power amplifier devices illustrated in FIGS. 5 and 7 have so far been described in connection with either two-divider 31 and two-combiner 35 or four-divider 36 and four-combiner 37 for carrying out inphase division and combination. When use is made of a combiner for inphase adding the signal components produced by N FF circuits, operation is not different from that of these power amplifier devices. It is consequently possible to use, as the divider 31 or 36, a divider, such as a 3-dB coupler, having a predetermined phase difference and to, as the combiner 35 or 37, use a combiner for combining, in a phase of cancelling the predetermined phase difference, the signal components having the predetermined phase difference.

In the manner thus far described, N FF circuits are put into parallel operation with their outputs inphase added to provide an output signal in a power amplifier according to this invention. It is therefore possible to improve the rate of signal components versus distortion components, namely, the attenuation of intermodulation distortion, by $(10 \times \log N)$ dB as compared with use of a single FF circuit. Further merits are compactness and low power consumption.

Compactness of the power amplifier device results in a reduction in number of power transistors used as the power amplifying elements and of like expensive parts and accordingly a reduction in the cost of manufacture. Low power consumption results in a reduction in the cost of operation keeping. Merits are therefore astonishing as regards economic efficiencies.

Each FF circuit is capable of reducing thermal noise produced by power amplifying elements. Parallel operation in this invention enlarges this improvement as an additional merit.

Distortion compensation is carried out by each FF circuit. Therefore, due distortion compensation is insured although the output power may be slightly reduced when one of N parallel FF circuits may become inoperative. In other words, an increase in the number of FF circuits brings about a raised reliability of the power amplifier device as a whole.

The above-described merits are overwhelming despite the fact that parallel operation of a plurality of FF circuits may give rise to a defect of increasing the number of parts other than the main amplifier circuit.

What is claimed is:

1. A power amplifier device comprising: an input terminal for receiving a plurality of radio frequency signals of different frequencies collectively as a composite radio frequency signal; an output terminal; and an amplifying section coupled to said input terminal for amplifying said composite radio frequency signal and for supplying said amplified composite radio frequency signal to said output terminal;
   wherein said amplifying section comprises:
   an N-divider coupled to said input terminal for dividing said composite radio frequency signal into N composite radio frequency signals of a common phase and of a common amplitude, N being an integer which is not less than two;
   N feedforward distortion compensating circuits having a common gain and a common phase characteristic for amplifying said N composite radio frequency signals to produce N amplified signal components, respectively; and
   an N-combiner for combining said N amplified signal components and for supplying said N amplified signal components to said output terminal in an inphase condition.

2. The power amplifier device of claim 1, wherein said power amplifier device is part of a mobile radio communication system, said input terminal being coupled for receiving a plurality of carrier signals of different frequencies as said plurality of radio frequency signals.

3. A power amplifier device comprising: an input terminal for receiving a plurality of radio frequency signals of different frequencies collectively as a composite radio frequency signal; an output terminal; and an amplifying section coupled to said input terminal for amplifying said composite radio frequency signal and for supplying said amplified composite radio frequency signal to said output terminal;
   wherein said amplifying section comprises:
   an N-divider coupled to said input terminal for dividing said composite radio frequency signal into N composite radio frequency signals of a common amplitude and a predetermined phase difference between each pair, N being an integer which is not less than two;
   N feedforward distortion compensating circuits having a common gain and a common phase characteristic for amplifying said N composite radio frequency signals to produce N amplified signal components, respectively; and
   an N-combiner for combining said N amplified signal components and for supplying said N amplified signal components to said output terminal in such a phase for canceling said predetermined phase difference.

4. The power amplifier device of claim 3, wherein said power amplifier device is part of a mobile radio communication system, said input terminal being coupled for receiving a plurality of carrier signals of different frequencies as said plurality of radio frequency signals.

* * * * *

UNITED STATES PATENT AND TRADEMARK OFFICE
CERTIFICATE OF CORRECTION

PATENT NO. : 5,412,342
DATED      : May 2, 1995
INVENTOR(S): Sakamoto et al

It is certified that error appears in the above-indentified patent and that said Letters Patent is hereby corrected as shown below:

Title page, Item [30] Foreign Application Priority Data,

"3-005416" should be --4-005416--.

Column 1, line 27, after "frequencies" insert
    --and collectively as a composite radio
       frequency--.

Signed and Sealed this

Seventeenth Day of December, 1996

Attest:

BRUCE LEHMAN

*Attesting Officer*    *Commissioner of Patents and Trademarks*